(12) United States Patent
Kamada

(10) Patent No.: US 10,109,777 B2
(45) Date of Patent: Oct. 23, 2018

(54) LIGHT EMITTING DEVICE

(71) Applicant: NICHIA CORPORATION, Anan-shi, Tokushima (JP)

(72) Inventor: Kazuhiro Kamada, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/595,725

(22) Filed: May 15, 2017

(65) Prior Publication Data

US 2017/0250326 A1 Aug. 31, 2017

Related U.S. Application Data

(63) Continuation of application No. 13/956,496, filed on Aug. 1, 2013, now Pat. No. 9,709,223.

(30) Foreign Application Priority Data

Aug. 9, 2012 (JP) .................................. 2012-176846

(51) Int. Cl.
| | |
|---|---|
| *H01L 33/56* | (2010.01) |
| *F21K 9/60* | (2016.01) |
| *H01L 33/44* | (2010.01) |
| *H01L 33/54* | (2010.01) |
| *H01L 33/60* | (2010.01) |
| *H01L 33/62* | (2010.01) |

(52) U.S. Cl.
CPC ................ *H01L 33/56* (2013.01); *F21K 9/60* (2016.08); *H01L 33/44* (2013.01); *H01L 33/54* (2013.01);
(Continued)

(58) Field of Classification Search
CPC ......... H01L 33/56; H01L 33/60; H01L 33/44; H01L 33/62; H01L 2224/48137;
(Continued)

(56) References Cited

U.S. PATENT DOCUMENTS

| | | |
|---|---|---|
| 6,849,932 B2 | 2/2005 | Tsai et al. |
| 8,167,456 B2 | 5/2012 | Sanpei et al. |

(Continued)

FOREIGN PATENT DOCUMENTS

| | | |
|---|---|---|
| EP | 2482346 A1 | 8/2012 |
| JP | 2004-172160 A | 6/2004 |

(Continued)

OTHER PUBLICATIONS

Extended European Search Report of the corresponding European application No. 13179338.2, dated Dec. 9, 2013.

*Primary Examiner* — Kevin Quarterman

(57) ABSTRACT

A light emitting device includes a substrate, a light emitting element, a first resin member, and a second resin member. The substrate includes a base member, a plurality of wiring portions disposed on a first surface and a second surface of the base member, and a covering layer that covers the wiring portions disposed on the first surface and has an opening formed in a part of the covering layer. The light emitting element is arranged on the wiring portions disposed on the first surface in the opening of the covering layer and having an upper surface at a position higher than the covering layer. The first resin member is arranged at least in the opening of the covering layer and at periphery of the light emitting element. The second resin member seals the substrate and the light emitting element and has an outer border that is arranged above the covering layer. The covering layer is exposed at an outer side of the second resin member. The wiring portions disposed on the second surface are not directly or indirectly electrically connected to the light emitting element.

12 Claims, 4 Drawing Sheets

(52) U.S. Cl.
CPC .............. *H01L 33/60* (2013.01); *H01L 33/62* (2013.01); *H01L 2224/48091* (2013.01); *H01L 2224/48137* (2013.01); *H01L 2224/48471* (2013.01); *H01L 2224/49107* (2013.01); *H01L 2224/73265* (2013.01); *H01L 2224/8592* (2013.01)

(58) Field of Classification Search
CPC ... H01L 2224/49107; H01L 2224/8592; H01L 2224/48471
See application file for complete search history.

(56) References Cited

U.S. PATENT DOCUMENTS

| | | |
|---|---|---|
| 2002/0043926 A1 | 4/2002 | Takahashi et al. |
| 2006/0138621 A1* | 6/2006 | Bogner ................. H01L 33/64 257/678 |
| 2006/0186431 A1 | 8/2006 | Miki et al. |
| 2007/0145401 A1 | 6/2007 | Ikehara |
| 2007/0170454 A1 | 7/2007 | Andrews |
| 2008/0093606 A1* | 4/2008 | Pan ......................... H01L 24/97 257/81 |
| 2008/0157333 A1 | 7/2008 | Lin et al. |
| 2008/0258164 A1 | 10/2008 | Masui et al. |
| 2009/0141492 A1 | 6/2009 | Fujino et al. |

FOREIGN PATENT DOCUMENTS

| | | |
|---|---|---|
| JP | 2007-201171 A | 8/2007 |
| JP | 2008-124088 A | 5/2008 |
| JP | 2008-166462 A | 7/2008 |
| JP | 2008-258296 A | 10/2008 |
| JP | 2010-283244 A | 12/2010 |
| JP | 2012-009793 A | 1/2012 |
| WO | 2011-144385 A1 | 11/2011 |

* cited by examiner

LIGHT EMITTING DEVICE

CROSS-REFERENCE TO RELATED APPLICATIONS

This application is a continuation application of U.S. patent application Ser. No. 13/956,496, filed on Aug. 1, 2013. This application claims priority to Japanese Patent Application No. 2012-176846 filed in Japan on Aug. 9, 2012. The entire disclosures of U.S. patent application Ser. No. 13/956,496 and Japanese Patent Application No. 2012-176846 are incorporated hereinto by reference.

BACKGROUND OF THE INVENTION

1. Field of the Invention

The present invention relates to a light emitting device in which a sealing member is disposed on a substrate and a light emitting element.

2. Background Information

Conventionally, there is proposed a light emitting device in which a light emitting element and other components are arranged on a substrate.

In such a light emitting device, in order to maintain the brightness and directivity etc., the light emitting element may be covered with a light transmissive resin member having a shape which can exert lens effect or the like (for example, see JP 2007-201171A).

However, a lens-shape sealing resin member which is protruded high from the substrate may easily detach from the substrate by receiving impact from outside or the like.

SUMMARY OF THE INVENTION

The present invention is devised to solve the problems as described above, and has an object of providing a light emitting device having a sealing resin member which has greater adhesion.

The present invention includes the aspects described below.

A light emitting device includes a substrate, a light emitting element, a first resin member, and a second resin member.

The substrate includes a base member, a plurality of wiring portions disposed on a first surface and a second surface of the base member, and a covering layer that covers the wiring portions disposed on the first surface and has an opening formed in a part of the covering layer. The light emitting element is arranged on the wiring portions disposed on the first surface in the opening of the covering layer and having an upper surface at a position higher than the covering layer. The first resin member is arranged at least in the opening of the covering layer and at periphery of the light emitting element. The second resin member seals the substrate and the light emitting element and has an outer border that is arranged above the covering layer.

The covering layer is exposed at an outer side of the second resin member. The wiring portions disposed on the second surface are not directly or indirectly electrically connected to the light emitting element.

According to the aspect of the invention, the wiring portions are further disposed at an inner side of the base member in addition to the first surface and the second surface.

According to the aspect of the invention, the light emitting element includes a plurality of light emitting elements, and the covering layer includes a plurality of openings such that the light emitting elements are arranged in the openings, respectively.

According to the aspect of the invention, the light emitting element is mounted in a flip-chip manner.

According to the aspect of the invention, the light emitting element is mounted using a solder According to the aspect of the invention, the second resin member has a hemispherical convex shape.

DETAILED DESCRIPTION OF EMBODIMENTS

Figure 1A:
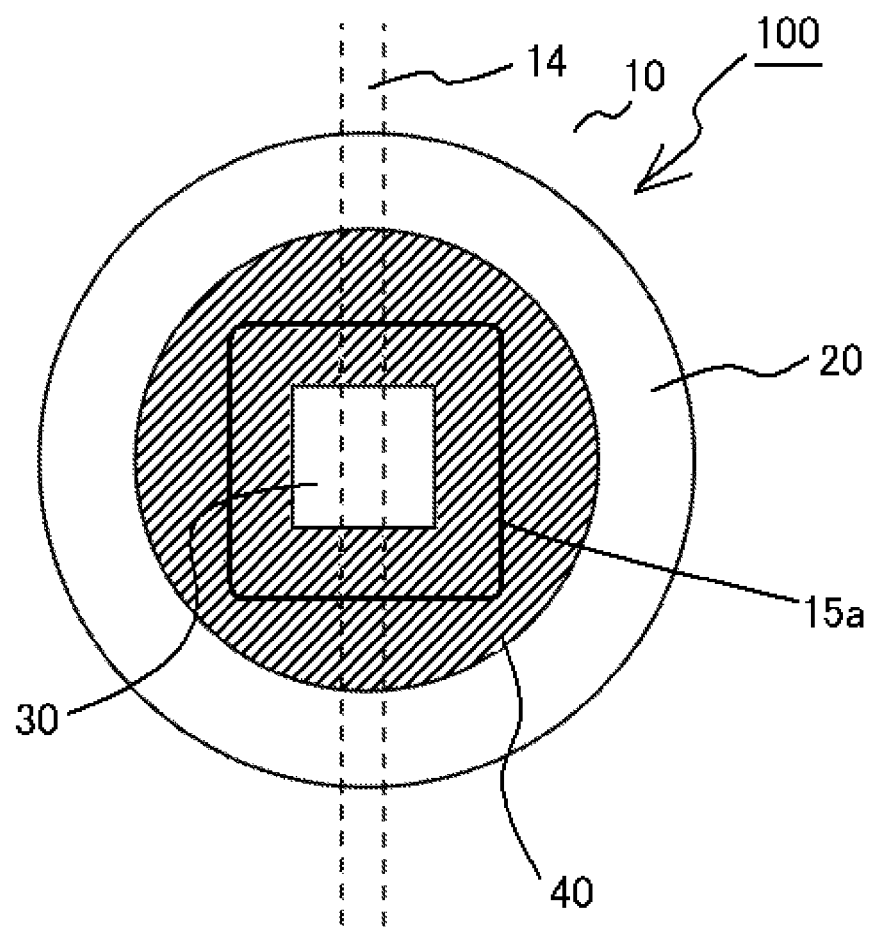
FIG. 1A is a schematic plan view showing an embodiment of a light emitting device according to the present invention.

A light emitting device according to an embodiment of the present invention includes a substrate, a light emitting element, a first resin member, and a second resin member.

Substrate

The substrate includes at least a base member, a plurality of wiring portions disposed on the base member, and a covering layer disposed on the wiring portions. The base member is a basis material for a light emitting device and can be formed by using an appropriate material according to the purpose and applications. The material of the base can be appropriately selected in view of the type of mounting of the light emitting elements, the reflectance, adhesiveness with other members, etc, and examples thereof include insulating materials such as plastic, glass, and ceramics. More specifically, a resin such as polyethylene terephthalate and polyimide may be preferably used. Particularly, in the case where solder is used for mounting the light emitting element, polyimide, which has high thermal resistance, is more preferably used. In addition, a material having high optical reflectance (for example, a white filler such as titanium oxide) may be contained in the material constituting the base member. The thickness of the base member is not specifically limited and for example, a thickness of about 10 μm to several mm can be employed. The substrate may have flexibility, and in such a case, the thickness of 10 μm to 100 μm can be employed.

The base member can be formed with an appropriate shape (size, length) according to the purpose and usage. For example, a shape such as a quadrangular shape, a rectangular shape, a polygonal shape, a circular shape, an elliptical shape, or a shape which is a combination of these shapes can be employed. In the case where the light emitting device according to an embodiment of the present invention is used for straight tube-type lamps, an elongated shape with a length ten times or greater than its width in lateral direction may be preferably employed. More specifically, for a straight tube-type lamp with a length of about 120 cm, a base member having a width of 0.5 cm to 5 cm and a length of 30 cm to 120 cm may be employed. Particularly, in the case of employing a flexible base which allows its use in a deformed state such as in a curved or bent shape, the flexible base member having a width and length several mm to several cm greater than the width and length of corresponding straight tube-type lighting can be used. Also, in the case where a flexible base member is employed, several units of such an elongated base member (substrate) can be processed together by way of roll-to-roll method. In this case, sprocket holes may be provided in the base member.

The plurality of wiring portions are electrically conductive members which allow an external power source to be connected and are disposed on one surface of the base member, then directly or indirectly connected to the light emitting element. The wiring portions may be made of an electrically conductive thin layer having a single-layer structure or a stacked-layer structure of metal such as copper or aluminum or alloy thereof. The wiring portion may be arranged not only on a surface of the base member, but also on an inner side or on another surface, according to the kinds of the base member. The thickness of the wiring portion is not specifically limited and a thickness of the wiring portions of the substrates generally used in the art can be applied. For example, about several μm to several mm can be employed. Particularly, in the case where a flexible base member is used as described above, the wiring portions preferably have a thickness which does not impair the flexibility, and thus, for example, a thickness of about 8 μm to 150 μm may be employed.

The shape (pattern) of a plurality of wiring portions is not specifically limited, and generally, a similar shape or a shape conforming to the shape or pattern of the wiring of the substrate for mounting the light emitting element may be employed. The shape is preferably designed in further consideration of, such as heat releasing property and/or mechanical strength. For example, a polygonal shape such as a crank shape, a triangular shape, and a quadrangular shape, a shape with no sharp corners such as a circular shape and an elliptical shape, and a shape of those with partially irregular shape may be employed singly or in combination. The corners of the wiring portions are preferably rounded.

The plurality of wiring portions are arranged spaced apart from each other in which, in addition to the wiring portions directly or indirectly electrically connected to corresponding light emitting elements (that is, the wiring portions for providing electrical continuity), a wiring portion which does not contribute to conduction of electricity and has a similar shape or a different shape may also be arranged. The wiring portion which does not contribute to providing electrical continuity can serve as a heat releasing member or a mounting portion for the light emitting element. For example, in the case where the base member has a rectangular shape, the wiring portions which do not contribute to providing electrical continuity are preferably extended to the end portions in the longitudinal direction and also in the lateral direction, arranged at the both sides of the wiring portions. The wiring portions may be provided with terminals for external connection. For example, connectors etc. may be arranged to supply electricity to light emitting elements from external power source. Such a wiring portion, particularly in the case where it is arranged on a flexible base member, can reduce stress which is generated by, for example, bending of the substrate and loaded on the light emitting element and the second resin member, by arranging a part thereof on an approximately the entire area (preferably in continuous manner). Specifically, in the case where a base member of elongated shape is used, the wiring portions are preferably arranged elongated along the longitudinal direction of the base member, and more preferably, the wiring portions are arranged with a length of ⅓ to 1 of the longitudinal length of the base member.

The wiring portions capable of contributing to conduction of electricity are made up of a positive terminal and a negative terminal and the number of the wiring portions which constitute a pair of the terminal is not specifically limited. For example, each of the pair of terminal portions may be made up of a single terminal or may be made up of a plurality of terminals. The wiring portions capable of contributing to conduction of electricity are, for example, preferably connected to a pair of external wirings respectively. With this arrangement, electric power is supplied from external wirings. The pair of external wirings are preferably connected to corresponding portions of known connectors (not shown).

As described above, arranging of the wiring portions in a relatively large planar dimension with a combination of wiring portions having various shapes allows increase of the arrangement degree of freedom of the light emitting device. For example, with a rectangular base member, it can be possible that six light emitting elements are arranged three in the longitudinal direction and two in the lateral direction as one block and connected in parallel, then, twelve blocks are arranged in the longitudinal direction and connected in series by the wiring portions which can serve as a pair of terminal portions. It may be such that the base member has an approximately square shape, an approximately circular shape, or an approximately ellipsoidal shape, where one light emitting element is connected to standard positive and negative wiring portions respectively. Arranging the wiring portions on one surface respectively with the largest possible planar dimension allows an increase in heat dissipation.

On one surface of the base member, the plurality of wiring portions are spaced apart from each other, which provides grooves where the wiring portions are not disposed (that is, portions where the base member is exposed). The grooves are arranged between the wiring portions, so that the shapes of the grooves are in conformity to the shapes of the wiring portions, which may be, for example, a crank shape. The width of the grooves is preferably narrower than the width of the wiring portions, in other words, the wiring portions preferably have a large planar dimension, and for example, a width of about 0.05 mm to 5 mm may be employed.

Further, in the case where the wiring portions (both wiring portions contribute/not contribute to electrical continuity) are arranged on the whole area of one surface of the base member with a relatively large planar dimension, for example, even with the use of a flexible base member, appropriate strength can be added while maintaining its flexibility, so that disconnection of wiring portions and breakage of substrate due to bending of the flexible substrate can be efficiently prevented. More specifically, the wiring portions are arranged with an area preferably 50% or greater, more preferably 70% or greater, further preferably 90% or greater than the area of the base member.

The covering layer covering the wiring portions preferably can serve as a reflective layer to reflect the light emitted from the light emitting element. The covering layer has, as will be described later, an opening in part thereof, from which the wiring portions are exposed. The covering layer preferably covers approximately the entire surface of the substrate except for the opening, thus, the covering layer preferably covers the groove portions between the wiring portions described above.

The covering layer has an opening in part thereof, as described above. In order to connect the light emitting element with two, the positive and negative, wiring portions, the opening is arranged to expose the wiring portions. The shape and size of the opening are not specifically limited, but a minimum size sufficient for electrical connection of the light emitting element with the wiring portions is preferable. In the case of flip-chip mounting, a part of groove is preferably exposed in a single opening.

Generally, the number and arrangement of light emitting elements are adjusted according to the output power, light distribution, or the like of the light emitting device, and accordingly, the number and the positions of the openings are arranged. The number of the openings may be the same as the number of the light emitting element or the number of the openings may be different than the number of the light emitting element. For example, in the case where 20 units of light emitting elements are needed and each light emitting element to be mounted in one opening, 20 openings are arranged in the covering layer. Alternatively, in the case where two light emitting elements to be mounted in one opening, 10 openings are arranged. In some cases, the light emitting elements may not be mounted in the openings. For example, in the case where the light emitting devices are manufactured in several ranks (for example, light emitting devices of different outputs), with the use of a same substrate (that is, the number and arrangement of the openings provided in the covering layer are the same), an opening can be provided without having a light emitting element, which allows obtaining of different optical output. Also, a region lacking the covering layer may be arranged in the region for establishing electrical continuity such as a connector.

The covering layer is preferably made of a material which reflects emission of the light emitting element and wavelength-converted light by a wavelength converting member to be described later. Examples of the materials include a resin such as a phenol resin, an epoxy resin, a BT resin, a PPA, a silicone resin and a urea resin. Also, those materials may be added with a filler such as $SiO_2$, $TiO_2$, $Al_2O_3$, $ZrO_2$, or MgO, for example.

The covering layer is preferably disposed with a relatively small thickness, and particularly preferable that the covering layer is disposed so that the upper surface of the light emitting element is higher than the covering layer. With such a thickness, the first resin member to be described later can be arranged on the side surfaces of the light emitting element. As a result, a broad distribution of light can be obtained and which is suitable for applications particularly in lighting.

Light Emitting Element

In the above-described opening of the covering layer on the substrate, the light emitting element may be arranged on the two wiring portions in a bridged manner or arranged on a single wiring portion. With such arrangements, the light emitting element can be electrically connected to the pair of positive and negative wiring portions respectively. The number and/or tone of color tone and/or arrangement of a plurality of light emitting elements are determined to satisfy the output and light distribution designed for the light emitting device. It is therefore accordingly the shape and arrangement of the wiring portions and/or openings of the covering layer are adjusted.

The light emitting element includes a semiconductor structure, a p-side electrode, and an n-side electrode. The semiconductor structure, for example, includes an n-type layer, an active layer, and a p-type layer respectively made of a gallium nitride-based semiconductor and stacked in the order on a light-transmissive sapphire substrate. It is not limited to a gallium nitride-based semiconductor, but also, a group II-VI based semiconductor or a group III-V based semiconductor may be used. The n-side electrode and the p-side electrode can be formed with a single layer or staked-layer of known materials.

The light emitting element may be mounted on the substrate in a flip-chip manner or a face-up manner. In the case of flip-chip mounting, the p-side electrode and the n-side electrode of the light emitting element are connected to a pair of wiring portions via a pair of bonding member respectively. For the bonding member, for example, a solder of Sn—Ag—Cu based, Sn—Cu based, or an Au—Sn based, or a metal bump such as Au can be used. In the case of face-up mounting, the light emitting element is fixed on the base member (on the wiring portion) by an insulating bonding member such as a resin or by an electrically conductive bonding member as described above, and then, electrically connected to the wiring portions via wires. In the case where the substrate of the light emitting element is electrically conductive, the light emitting element is electrically connected by the bonding member as described above.

In addition to the light emitting element, a protective element such as a Zener diode or a related component may be arranged on one surface of the substrate of the light emitting device. Such a protective element and related component may be arranged together in the opening where the light emitting element is mounted or in a different opening provided for them. Such members are preferably arranged at locations so as not to absorb the light from the light emitting element, and it is not necessary to dispose the same number of protective elements as the light emitting elements. Therefore, the protective element is preferably arranged at an appropriate position, for example, one protective element is mounted on a wiring portion, to which a plurality of light emitting elements are directly connected, at a position near a connector regardless of the arrangement of the light emitting elements.

First Resin Member

A first resin member is disposed at periphery of the light emitting element. The first resin member is to be disposed at least in the opening provided in the covering layer. Provided that, the first resin member may be disposed on the outer periphery of the opening of the covering layer, that is, the first resin member may be disposed extending onto the covering layer, or regardless of the wiring portions, for example, may be disposed in the grooves between the wiring portions and/or directly under the light emitting element.

The first resin member is preferably in contact with the outer edge (side surface) of the light emitting element. Generally, the light emitting element is mounted on the substrate by using a bonding member etc., but a part of the surfaces of the bonding member and/or the base member (for example, the wiring portions etc.) is generally more prone to deterioration due to light than the material of the first resin member. Therefore, in the case where a part of the surface etc., of the bonding member and/or the base member near the light emitting element is covered by the first resin member, light of relatively high intensity emitted from the light emitting element can no longer be irradiated directly on the bonding member and/or base member, so that deterioration by light of the constituent members of the light emitting device can be effectively avoided.

The end portion of the first resin member at the opposite side of the light emitting element may either be at the inner side or outer side of the outer periphery of the second resin member which to be described later, but of these locations, the end portion is preferably arranged approximately in conformity to the outer periphery or outer side of the outer periphery. With this arrangement, the contact area between the first resin member and the second resin member can be easily secured, so that the second resin member can be adhered more strongly to the light emitting device, in particular to the first resin member.

In other words, the size of the first resin member, that is, the planar dimension of the first resin member when the light emitting device is viewed in light extracting direction may be similar, larger, or smaller than the planar dimension of the sealing resin (the second resin) member, excluding the planar dimension of the light emitting element. Particularly, the size of the first resin member may be about ⅕ to 3 times, preferably about ¼ to 3 times, and more preferably ⅓ to 1.5 times of the planar dimension of the sealing resin (the second resin) member excluding the planar dimension of the light emitting element. Thus, with a large planar dimension of the first resin member, the contact area with the second resin member increases as described later, so that due to the adhesion of the both, the adhesion of the second resin member of the light emitting device can be further enhanced.

The first resin member may be disposed, for example, with a thickness in a range of several μm to several hundred μm. Particularly, portions in contact with the light emitting element preferably have a thickness corresponding to or less than the height of the side surfaces of the light emitting element. In the case where the first resin member is disposed in the whole portion of the opening, the portion in contact with the outer periphery of the opening preferably has a thickness not exceeding the depth of the opening. Preferably, the thickness of the first resin member decreases from the light emitting element outward (outer side with respect to the canter of the light emitting element).

The first resin member can be formed for example by using a resin having its base polymer of, a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins. Of those, a resin containing a silicone resin and/or an epoxy resin as its base polymer is preferable. In the specification, the term "a base polymer" means a resin having a highest content of the materials constituting the first resin member. The first resin member preferably contains, for example, a reflective material and/or diffusion material such as $SiO_2$, $TiO_2$, $Al_2O_3$, $ZrO_2$, and MgO. With this arrangement, light can be reflected sufficiently. The first resin member may be made of a single material or a combination of two or more materials. With this arrangement, the reflectance of light can be adjusted and also the linear expansion coefficient of the resin can be adjusted.

Second Resin Member

The second resin seals (covers) the light emitting element on the substrate. The second resin member preferably has transparency to the light from the light emitting element and light resistance and electrical insulation properties. The second resin member may be arranged to cover all the openings of the covering layer described above, or not to cover some of the openings. In the specification, the term "transparency to light" means properties of transmitting about 60% or greater emission of the light emitting element, more preferably 70% or greater, or even more preferably 80% or greater of light emitted from the light emitting element.

The second resin member can be formed for example by using a silicone resin composition, a modified silicone resin composition, an epoxy resin composition, a modified epoxy resin composition, an acrylic resin composition, a silicone resin, an epoxy resin, a urea resin, a fluororesin, or a hybrid resin containing one or more of those resins. Particularly, the second resin member is preferably formed, including the same polymer as in the first resin member as described above, more particularly, including the same polymer constituting the base polymer of the first resin member, and more preferably including the same polymer of the base polymer of the first resin member as the base polymer of the second resin member. With this arrangement, at the portion where the second resin member is in contact with the first resin member, suitability and compatibility of the both resin members are preferable, so that the adhesion with the first resin member can be further secured, and strong adhesion of the second resin member in the light emitting device can be realized.

The second resin member preferably includes a wavelength converting member such as a fluorescent material capable of absorbing light from the light emitting element and emitting light of different wavelength. Examples of such a wavelength converting member include an oxide-based fluorescent material, a sulfide-based fluorescent material, and a nitride-based fluorescent material. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material to emit green light, and a SCASN-based fluorescent material and a CASN-based fluorescent material to emit red light, are preferably used singly or in combination. Particularly, for the light emitting devices used for the display devices such as backlights of liquid crystal displays and TV-screens, a SiAlON fluorescent material and a SCASN fluorescent material are preferably used singly or in combination. Also, for lighting applications, a YAG-based fluorescent material or a LAG-based fluorescent material and a SCASN-based fluorescent material or a CASN-based fluorescent material are preferably used in combination. The second resin member may contain a light diffusing agent (barium sulfate, titanium oxide, aluminum oxide, silicon oxide, etc).

The shape of the second resin member is not specifically limited, but in view of light luminous intensity distribution and directivity of the light emitted from the light emitting element, a concave lens shape or a convex lens shape is preferably employed. Of those, a hemispherical convex lens shape may be most suitably employed.

The size of the second resin member is not specifically limited and appropriately adjusted in view of the brightness, directivity, etc., of the light emitting device. Particularly, the second resin member preferably has a size which can secure wider contact area with the first resin member, but in the case where a flexible substrate is employed, a size which does not impair the flexibility of the flexible substrate is preferable. For example, the size which allows completely covering the light emitting element or greater, preferably has a diameter or length of about ten timed or less, and more preferably has a diameter or length of about twice or less of the length of a side of the light emitting element. More specifically, the second resin member having a side (or diameter) of about 1 mm to 4 mm can be employed. The second resin member may be disposed with its outer periphery or border arranged either on the covering layer, over the covering layer and also on the first resin member, or on the first resin member in the opening of the covering layer.

The embodiments according to the present invention will be described below with reference to the drawings.

Embodiment 1

Figure 1B:
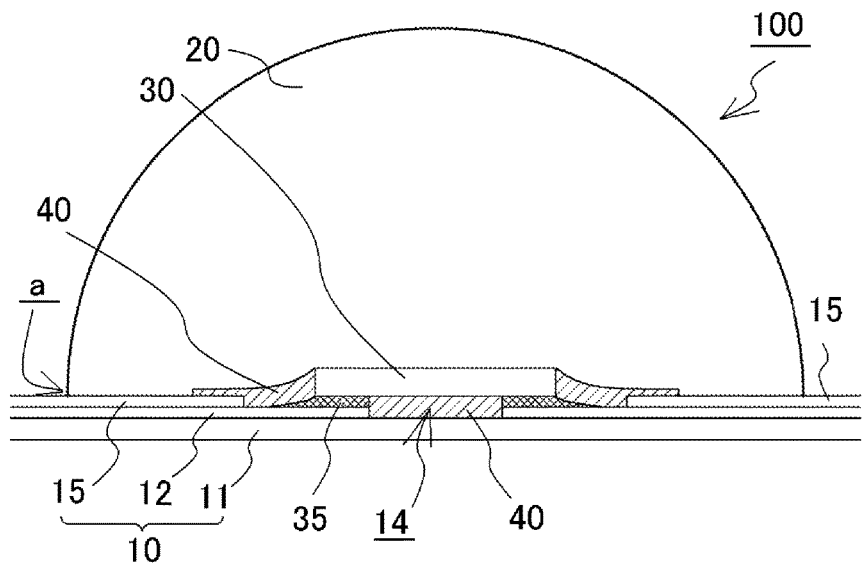
FIG. 1B is a schematic cross-sectional view showing an embodiment of a light emitting device according to the present invention.

The light emitting device 100 of Embodiment 1 includes, as shown in FIG. 1A and FIG. 1B, a substrate 10, a light emitting element 30 arranged on a surface of the substrate 10, a first resin member 40 arranged around the light emitting element 30, and a second resin member 20 arranged on the substrate 10 and covering the light emitting element 30.

The substrate 10 has a stacked layer structure made up of a flexible base member 11 made of a polyimide (about 25 μm thickness), wiring portions 12 (about 35 μm thickness) arranged on one surface of the base member 11 and spaced apart from each other by a groove portion 14, and an insulating covering layer 15 (about 15 μm thickness and made of a silicone-based resin containing titanium oxide) disposed over them. In order to establish electrical connection with the light emitting element 30, a groove portion 14 between the wiring portions 12 and the wiring portion 12 are exposed from the covering layer 15 in a region of the substrate 10. Among the wiring portions 12, a pair of wiring portions are connected to external terminals respectively (not shown).

The light emitting element 30 includes a semiconductor structure, a p-side electrode, and an n-side electrode (not shown). In the semiconductor structure, the p-type semiconductor layer and the light emitting layer are partially removed to expose the n-type semiconductor layer, and an n-side electrode is formed on the exposed surface. A p-side electrode is formed on the upper surface of the p-type semiconductor layer. Thus, the n-side electrode and the p-side electrode are formed on the same surface side with respect to the semiconductor structure. The light emitting element 30 as described above is arranged on a pair of the wiring portions 12 which are exposed from the covering layer 15 of the substrate 10, with the surface having the n-side electrode and the p-side electrode facing downward, and is electrically connected to the wiring portions via the bonding member 35. The bonding member 35 is generally disposed spread out from the outer border of the light emitting element 30 to its outer periphery.

The first resin member 40 is disposed on the surface of the substrate 10 at a periphery of the region where the light emitting element 30 is disposed. The first resin member 40 is, for example, made of a silicone resin containing about 30 weight % of titanium oxide. The first resin member 40 is arranged from the outer periphery of the light emitting element 30 and on the bonding member 35 to the peripheral region of the light emitting element, on the all portion in the opening and further onto a part of the covering layer 15. The thickness of the first resin 40 can be approximately the same as the height of the light emitting element 30 at the light emitting element 30 side, and can be gradually reduced on the bonding member 35 to reach about 10 μm thickness on the covering layer 15. The length from the end portion of the first resin member 40 at the light emitting element 30 side to the end portion at the opposite side is about 1 mm.

As described above, in the case where the first resin member 40 is arranged at the outer periphery of the light emitting element 30 with a relatively large planar dimension, even with a second resin member having a poor adhesion with the bonding member 35 and wiring portions 12 etc., the second resin member 20 can be in contact with the first resin member 40 which has better adhesion at a larger contact area, so that the second resin member 20 can be firmly adhered to the substrate 10. The first resin member 40 has a reflectance higher than that of the bonding member 35 and the wiring portions 12, so that extraction of light from the light emitting element can be performed more efficiently.

The second resin member 20 is disposed on the substrate 10 mounted with the light emitting element 30, on the portions including the light emitting element 30, the first resin member 40 arranged around the light emitting element 30, and a portion of the covering layer 15 disposed from directly under the first resin member 40 on the covering layer 15 arranged on an outer side of the light emitting element 30. The second resin member 20 is, for example, made of a silicone resin containing about 10 weight % of a fluorescent material (LAG•SCASN). That is, the second resin member 20 contains the same type of polymer used to make the first resin member. The outer periphery or border a of the second resin member 20 is arranged on the covering layer 15 on the substrate 10. The second resin member 20 is formed in a hemispherical shape by potting. The diameter of the second resin member 20 is, for example, about 3.5 mm.

As described above, the second resin member 20 contains the same base polymer as in the first resin member 40, thus, the adhesion between the first and second resin members can be secured. Particularly, in the light emitting device 100, the first resin member 40 and the second resin member 20 are in contact with each other with the entire surface of the first resin member 40 and all the side surfaces of the first resin member 40 arranged on the covering layer 15, which enables further securing of the contact area of the both. Further, the resin members are disposed containing the same base polymer, so that good suitability and compatibility therebetween can be obtained and thus further firm adhesion can be realized. Moreover, the surfaces and the interface between the bonding member 35 and the wiring portions 12, and the interface between the wiring portions and the reflective layer 15 can be covered with the covering layer 40, so that optical degradation of those members and detachment or the like, due to the optical degradation can be effectively prevented.

Embodiment 2

Figure 2:
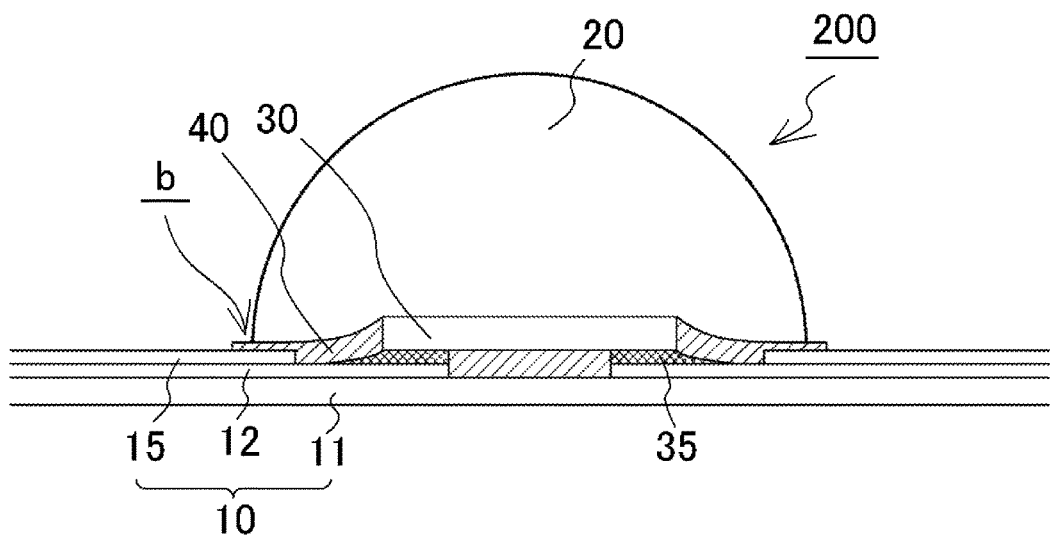
FIG. 2 is a schematic cross-sectional view showing another embodiment of a light emitting device according to the present invention.

The light emitting device 200 according to Embodiment 2 includes, for example as shown in FIG. 2, a structure substantially the same as in the light emitting element 100 except that the diameter of the second resin member 20 is reduced so that the outer periphery or border of the second resin member 20 is arranged from the end portion of the first resin member 40 reaching on the covering layer 15 on the substrate 10 to a center portion side of the light emitting element 30. That is, the outer periphery or border b of the second resin member 20 of the light emitting device 200 is arranged over the covering layer 15 via the first resin member 40. The diameter of the second resin member 20 is, for example, about 2 mm. The light emitting device 200 exhibits the same level of effects as that with the light emitting device 100 of Embodiment 1.

Embodiment 3

Figure 3:
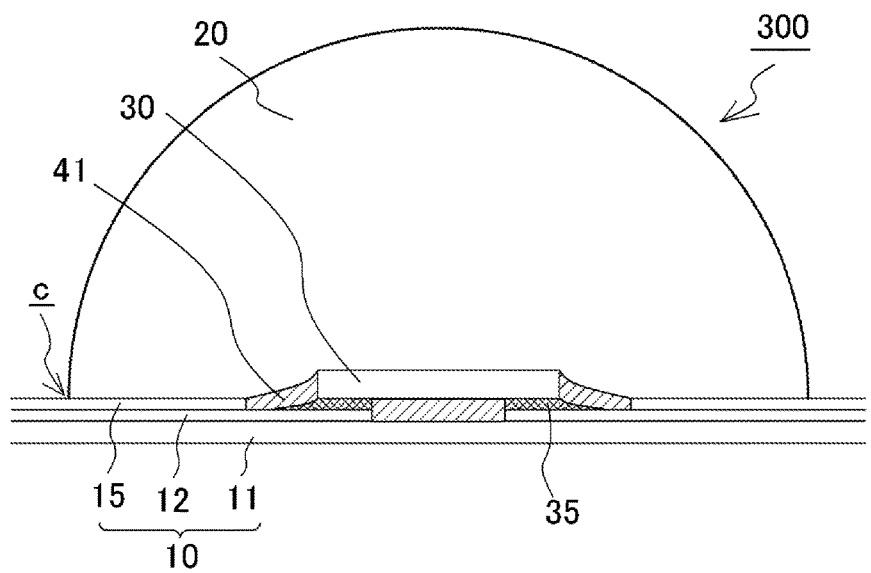
FIG. 3 is a schematic cross-sectional view showing yet another embodiment of a light emitting device according to the present invention.

The light emitting device 300 according to Embodiment 3 may include, for example as shown in FIG. 3, substantially the same structure as in the light emitting device 100 except that the first resin member 41 is disposed only in the opening of the covering layer 15. The outer periphery or border c of the second resin member 20 of the light emitting device 300 is arranged on the covering layer 15 on the substrate 10. The light emitting device 300 exhibits the same level of effects as that with the light emitting device 100 of Embodiment 1. Particularly, widening the opening formed in the covering layer 15 allows securing a greater contact area of the second resin member 20 to the first resin member 41 even the first resin member 41 is not extended on the covering layer 15, so that due to the adhesion between the first and second resin members 41, 20, the adhesion of the second resin 20 with the substrate 10 can be secured.

Embodiment 4

Figure 4:
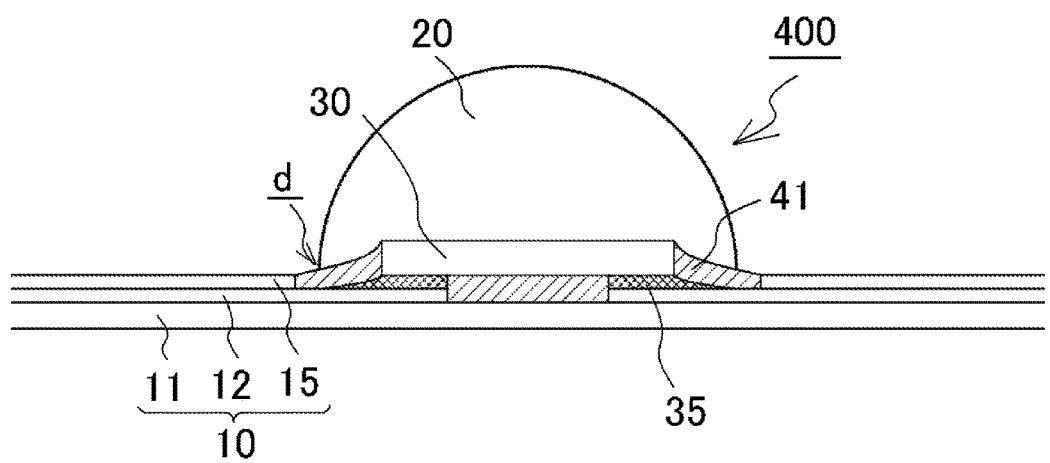
FIG. 4 is a schematic cross-sectional view showing yet another embodiment of a light emitting device according to the present invention.

The light emitting device 400 according to Embodiment 4 includes, for example as shown in FIG. 4, a structure substantially the same as in the light emitting element 300 except that the diameter of the second resin member 20 is reduced so that the outer periphery or border of the second resin member 20 is arranged from the end portion of the first resin member 41 reaching on the covering layer 15 on the substrate 10 to a center portion side of the light emitting element 30. That is, the outer periphery or border d of the second resin member 40 of the light emitting device 400 is arranged over the covering layer 15 via the first resin member 41. The diameter of the second resin member 20 is, for example, about 2 mm. The light emitting device 200 exhibits the same level of effects as that with the light emitting device 300 of Embodiment 3.

Embodiment 5

Figure 5:
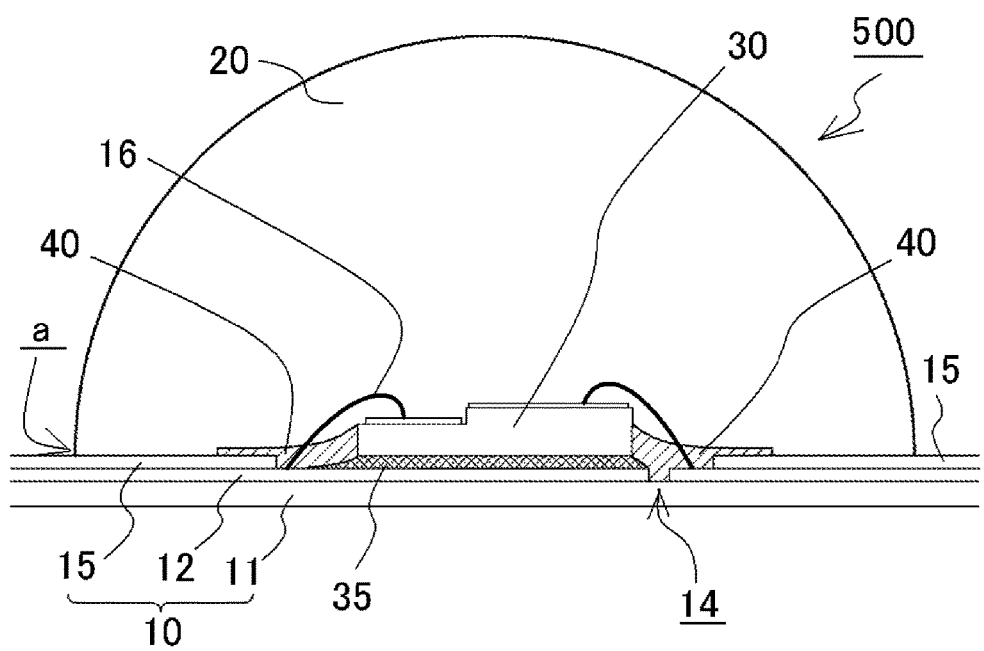
FIG. 5 is a schematic cross-sectional view showing yet another embodiment of a light emitting device according to the present invention.

The light emitting device 500 according to Embodiment 5 may include, for example as shown in FIG. 5, substantially the same structure as in the light emitting device 100, except that the light emitting element 30 is mounted in a face-up manner, the n-side electrode and the p-side electrode (not shown) of the light emitting element 30 are respectively electrically connected to the wiring portions 12 via wires 16, and a part of the wires 16 are covered with the first resin member 41. The light emitting device 500 exhibits the same level of effects as that with the light emitting device 100 of Embodiment 1. Further, this arrangement allows covering of the connecting portions of the wires 16 and the wiring portions 12 with the first resin member 40, so that for example optical degradation of those portions, detachment and breaking due to optical degradation of those portions can be efficiently prevented.

The light emitting device according to the illustrated embodiments can be used for various kinds of light sources, such as illumination light sources, light sources for various kinds of indicators, light sources for automobile use, light sources for displays, back light sources for liquid crystal displays, light sources for sensors, signals, automobile use, channel control characters for channel boards.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

According to one aspect of the embodiment, a light emitting device includes a substrate, a light emitting element, a first resin member and a second resin member. The substrate includes a base member, a plurality of wiring portions disposed on a surface of the base member, and a covering layer covering the wiring portions with an opening formed in a part of the covering layer. The light emitting element is arranged on the substrate in the opening of the covering layer and having an upper surface at a position higher than the covering layer. The first resin member is arranged at least in the opening of the covering layer and at periphery of the light emitting element. The second resin member seals the substrate and the light emitting element. The second resin member is disposed in contact with the first resin member.

The light emitting device as described above, in which the first resin member and the second resin member contain a same polymer.

The light emitting device according to any one of described above, in which the first resin member is arranged in an inner portion of the opening and over the covering layer.

The light emitting device according to any one of described above, in which an outer border of the second resin member is arranged on the covering layer.

The light emitting device according to any one of described above, in which an outer border of the second resin member is arranged above the covering layer and on the first resin member.

The light emitting device according to any one of described above, in which an outer border of the second resin member is arranged on the first resin member in the opening of the covering layer.

The light emitting device according to any one of described above, in which the first resin member further includes a reflective material.

The present embodiment can provide a light emitting device including a sealing resin member having good adhesion.

What is claimed is:
1. A light emitting device comprising:
   a substrate including a base member, a plurality of wiring portions disposed on a first surface and a second surface of the base member, and a covering layer covering the wiring portions disposed on the first surface and having an opening formed in a part of the covering layer;
   a light emitting element arranged on the wiring portions disposed on the first surface in the opening of the covering layer and having an upper surface at a position higher than the covering layer;
   a first resin member arranged at least in the opening of the covering layer and at periphery of the light emitting element; and
   a second resin member sealing the substrate and the light emitting element and having an outer border that is arranged above the covering layer,
   the covering layer being exposed to an outer environment at an outer side of the second resin member,
   the wiring portions disposed on the second surface being not directly or indirectly electrically connected to the light emitting element.

2. The light emitting device according to claim 1, wherein the wiring portions are further disposed at an inner side of the base member in addition to the first surface and the second surface.

3. The light emitting device according to claim 1, wherein the light emitting element includes a plurality of light emitting elements, and the covering layer includes a plurality of openings that includes the opening such that the light emitting elements are arranged in the openings, respectively.

4. The light emitting device according to claim 2, wherein the light emitting element includes a plurality of light emitting elements, and the covering layer includes a plurality of openings that includes the opening such that the light emitting elements are arranged in the openings, respectively.

5. The light emitting device according to claim 1, wherein the light emitting element is mounted in a flip-chip manner.

6. The light emitting device according to claim 2, wherein the light emitting element is mounted in a flip-chip manner.

7. The light emitting device according to claim 5, wherein the light emitting element is mounted using a solder.

8. The light emitting device according to claim 6, wherein the light emitting element is mounted using a solder.

9. The light emitting device according to claim 1, wherein the second resin member has a hemispherical convex shape.

10. The light emitting device according to claim 2, wherein the second resin member has a hemispherical convex shape.

11. The light emitting device according to claim 1, wherein the wiring portion is covered by the covering layer and not exposed to the outer environment at the outer side of the second resin member.

12. A light emitting device comprising:
a substrate including a base member, a plurality of wiring portions disposed on a first surface and a second surface of the base member, and a covering layer covering the wiring portions disposed on the first surface and having an opening formed in a part of the covering layer;
a light emitting element arranged on the wiring portions disposed on the first surface in the opening of the covering layer and having an upper surface at a position higher than the covering layer;
a first resin member arranged at least in the opening of the covering layer and at periphery of the light emitting element; and
a second resin member sealing the substrate and the light emitting element and having an outer border that is arranged above at least one of the covering layer and the first resin member,
the first resin member being exposed to an outer environment at an outer side of the second resin member,
a portion of the covering layer that is not covered by the first resin member being exposed to the outer environment, and
the wiring portions disposed on the second surface being not directly or indirectly electrically connected to the light emitting element.

* * * * *